United States Patent
Dijkstra

(10) Patent No.: US 7,868,827 B2
(45) Date of Patent: Jan. 11, 2011

(54) COUPLING FOR PATCH ANTENNAS

(75) Inventor: Patrick Walter Joseph Dijkstra, TJ Driebruggen (NL)

(73) Assignee: Stiching Noble House, AC Lisse (NL)

( * ) Notice: Subject to any disclaimer, the term of this patent is extended or adjusted under 35 U.S.C. 154(b) by 771 days.

(21) Appl. No.: 10/582,573

(22) PCT Filed: Dec. 10, 2004

(86) PCT No.: PCT/NL2004/000860

§ 371 (c)(1), (2), (4) Date: Feb. 21, 2007

(87) PCT Pub. No.: WO2005/057728

PCT Pub. Date: Jun. 23, 2005

(65) Prior Publication Data

US 2007/0290925 A1    Dec. 20, 2007

(30) Foreign Application Priority Data

Dec. 12, 2003 (NL) .................................. 1025002

(51) Int. Cl.
*H01Q 1/38* (2006.01)
(52) U.S. Cl. ............................. 343/700 MS; 343/702
(58) Field of Classification Search .......... 343/700 MS, 343/702
See application file for complete search history.

(56) References Cited

U.S. PATENT DOCUMENTS

| | | | |
|---|---|---|---|
| 5,483,678 A | 1/1996 | Abe | |
| 5,585,806 A * | 12/1996 | Ogino et al. | 343/700 MS |
| 5,903,239 A | 5/1999 | Takahashi et al. | |
| 6,320,543 B1 | 11/2001 | Ohata et al. | |
| 6,486,834 B2 * | 11/2002 | Tsai | 343/702 |
| 2005/0285794 A1 * | 12/2005 | Tang et al. | 343/700 MS |

FOREIGN PATENT DOCUMENTS

EP    0 978 729 A2    2/2000

OTHER PUBLICATIONS

Seki et al. "A Three-Dimensional Active Antenna for a High-Speed Wireless Communication Application" IEEE MTT-S Digest (1997) p. 975-978.

* cited by examiner

*Primary Examiner*—HoangAnh T Le
(74) *Attorney, Agent, or Firm*—Merchant & Gould P.C.

(57) ABSTRACT

Device comprising a patch antenna, and coupling means for connecting the antenna to an electronic component, wherein the patch antenna is arranged on one side of an antenna plate, and the electronic component can be mounted on the other side of the antenna plate, wherein the coupling means comprise a metal passage through the antenna plate. This passage thus ensures the transmission of signals between the antenna and the electronic component. Such a passage is mechanically very robust and not susceptible to ageing, whereby this passage is suitable for automotive applications. This passage is generally not ideal, since it does not have the same characteristic impedance as the antenna and the electronic component, but the dimensions of the passage can be kept sufficiently small so that no disruption is encountered from this impedance mismatch.

15 Claims, 2 Drawing Sheets

COUPLING FOR PATCH ANTENNAS

BACKGROUND OF THE INVENTION

The present invention relates to a device comprising a patch antenna, and coupling means for connecting the antenna to an electronic component such as a low noise amplifier (LNA), wherein the patch antenna is arranged on one side of an antenna plate.

In antennas for high-frequency applications the connection between the antenna and the first amplifier is very critical, since all losses which occur in this coupling have a negative effect on the reception sensitivity. According to a known coupling, a microstrip line is arranged on the underside of the ground plane of the patch antenna. At the position of this microstrip line a hole is made in the ground plane such that a capacitive coupling is realized between the microstrip line and the patch. Such a coupling has the drawback that not inappreciable stripline and impedance-mismatch losses occur. The matching of the impedances is moreover frequency-sensitive, so that such couplings cannot be properly matched over a determined bandwidth.

Another option consists of coupling by means of a whip antenna in a horn antenna. This coupling is however mechanically unstable and not suitable when a robust coupling is required. Another coupling option makes use of a direct clamping of two horn halves, wherein a ridge in the antenna is pressed against a track of the printed circuit board. Such a coupling has the drawback that corrosion problems occur, since the horn is manufactured from aluminium and the tracks on the printed circuit board are manufactured from copper or gilded. The two other stated options furthermore have the drawback that they are susceptible to ageing, whereby the signal losses increase over time.

U.S. Pat. No. 5,903,239 describes a device with a patch antenna which is arranged on one side of an antenna plate, and coupling means for connecting the antenna to an electronic component. The coupling means consist here of a passage and a microstrip line, and the electronic component is mounted on a second substrate mounted against the rear side of the antenna plate. Such a construction has the drawback that impedance-mismatch and substrate losses occur.

SUMMARY OF THE INVENTION

The invention has for its object to propose a device of the type stated in the preamble of claim 1, which is mechanically very robust, encounters little disruption from mis-adjustments of the impedances, and does not have the above stated drawbacks. The device according to the invention will hereby be particularly suitable for automobile applications.

The invention is distinguished for this purpose in that the electronic component can be mounted on the other side of the antenna plate and the coupling means comprise a metal passage through the antenna plate.

This passage, in combination with a mounting of the electronic component on the other side of the antenna plate, thus ensures the transmission of signals between the antenna and the electronic component. Such a passage is mechanically very robust and not susceptible to ageing, whereby this passage is suitable for automotive applications. This passage is generally not ideal, since it does not have the same characteristic impedance as the antenna and the electronic component, but the dimensions of the passage can be kept sufficiently small so that no disruption is encountered from this impedance mismatch.

By connecting the electronic component to the passage using a bond wire, electrical losses in the substrate do not affect operation, which is the case when a microstrip line is used.

The electronic component is typically an amplifier, and in particular a low noise amplifier.

According to a preferred embodiment of the invention, the length of the passage, as seen perpendicularly of the antenna plate, is smaller, and even more preferably many times smaller, than a quarter-wavelength of a signal to be processed by the antenna.

According to a further developed embodiment of the invention, the coupling means also comprise a metal bond wire for connecting the electronic component to the passage. This bond wire is typically manufactured from gold. The passage is further preferably gilded so that no chemical action takes place.

The length of the bond wire is preferably smaller, and even more preferably many times smaller, than a quarter-wavelength of a signal to be processed by the antenna. In this way is ensured that the impedance mismatch causes few losses.

According to an even further developed embodiment of the invention, an electrically conductive plate for the patch antenna is arranged against the antenna plate on the side of the electronic component, which electrically conductive plate is provided with a recess for the passage.

On the side of the electronic component the passage preferably transposes into a bond pad for the bond wire. This bond bad ensures that the bond wire can be arranged easily.

On the side of the antenna the passage preferably makes direct contact with a power supply line of the patch antenna. It is after all important to keep the dimensions of the coupling means as small as possible.

The passage preferably has a cylindrical shape, and preferably the peripheral distance of the passage substantially corresponds with the width of the power supply line. An optimal transition from passage to power supply line is hereby achieved.

The invention finally relates to a radar receiver provided with a device according to the invention.

BRIEF DESCRIPTION OF THE DRAWINGS

The invention will now be further elucidated on the basis of drawings of an exemplary embodiment of a device according to the invention. In the drawing.

DETAILED DESCRIPTION OF THE PREFERRED EMBODIMENTS

Figure 1:
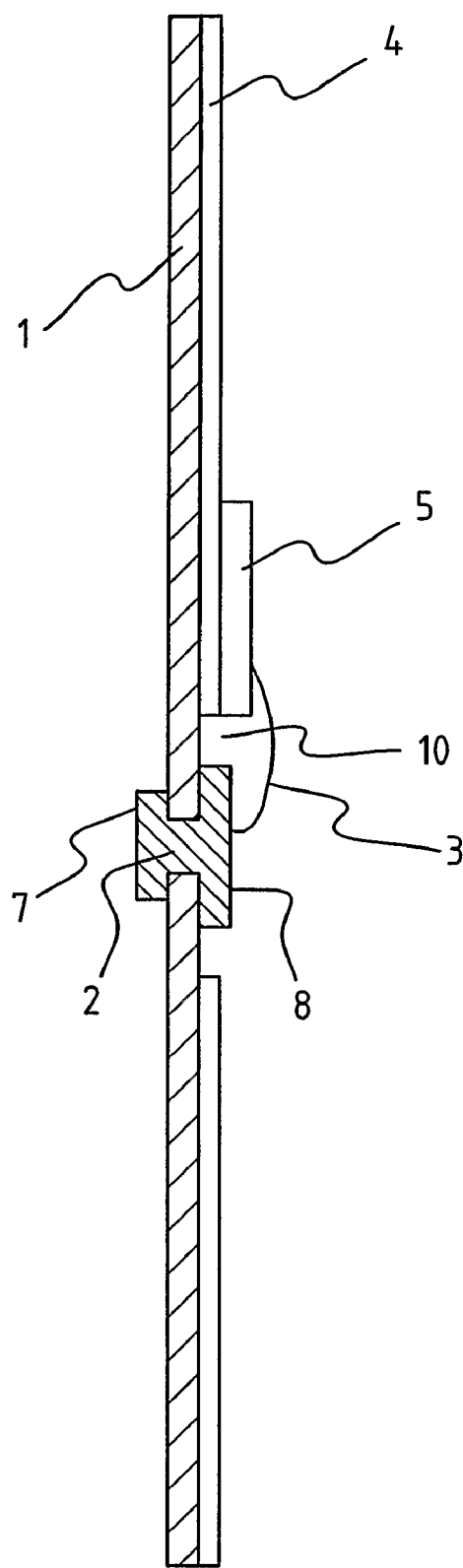
FIG. 1 is a cross-section of an embodiment according to the invention.
Figure 3:
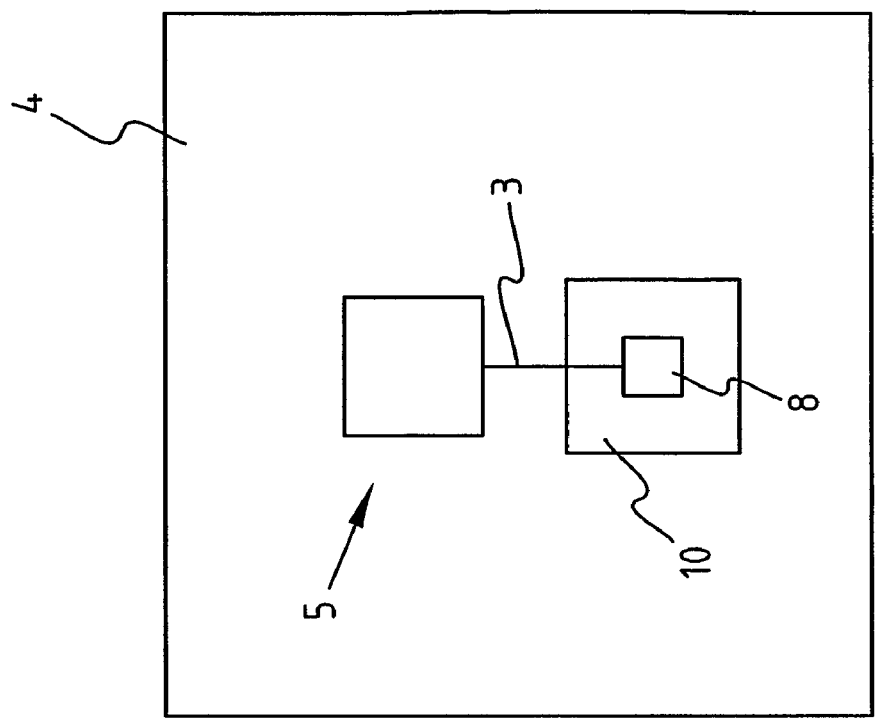
FIG. 3 is a bottom view of the embodiment of FIG. 1.
Figure 2:
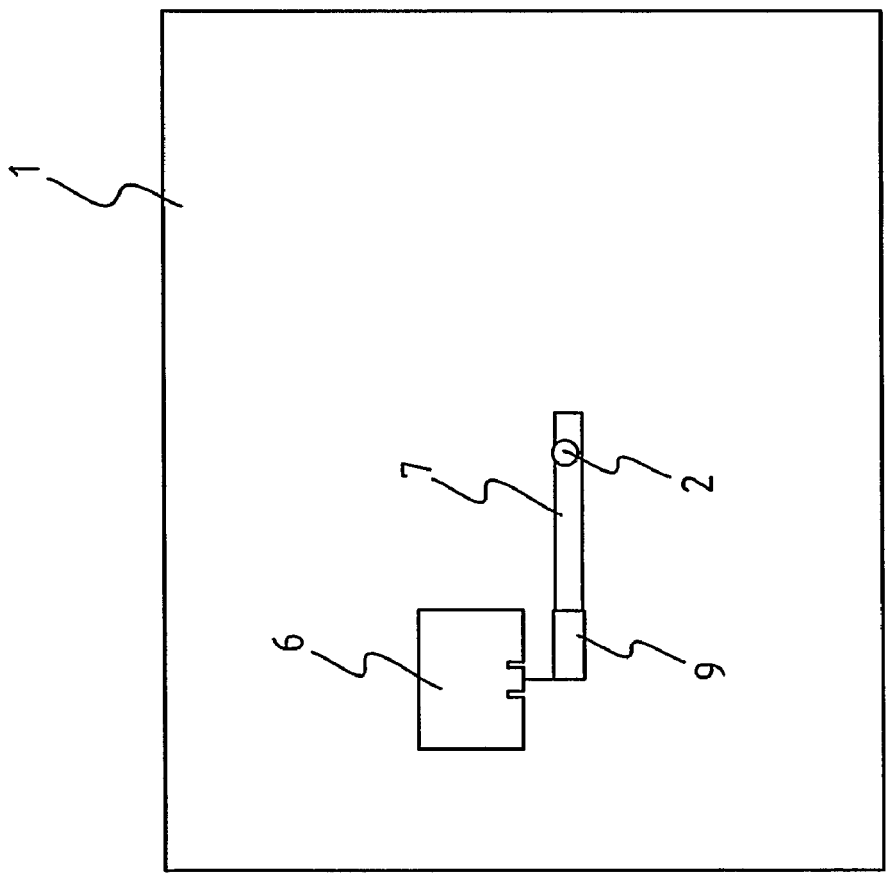
FIG. 2 is a top view of the embodiment of FIG. 1.

FIG. 1 shows antenna plate 1 (antenna PCB) of a patch antenna, which is provided on one side with a conductive plate (better known in specialist terminology as a "ground plane") 4 for the patch antenna. As can be seen in the top view of FIG. 2, patch antenna 6 is provided on one side of an antenna plate 1, while a low noise amplifier (LNA) 5 is mounted on ground plane 4 on the other side of antenna plate 1.

The coupling means between patch antenna 6 and LNA 5 comprise a metal passage 2 (better known in specialist terminology as a "via") through antenna plate 1 and electrically conductive plate 4, which is provided with a recess 10 for passage 2. On the side of LNA 5 the passage transposes into a bond pad 8, and on the side of patch antenna 6 makes direct contact with a power supply line 7 of patch antenna 6.

Passage 2 has a substantially cylindrical shape, and the peripheral length (pi multiplied by the diameter of the cylinder) is preferably about equal to the width of power supply line 7 of patch antenna 6.

The coupling means further comprise a metal bond wire 3 for connecting LNA 5 to bond pad 8.

The length of passage 2, as seen perpendicularly of antenna plate 1, is smaller than a quarter-wavelength of a signal to be processed by the antenna. The invention is typically applied for high-frequency antennas, in particular for frequencies above 10 GHz. At a frequency of 10 GHz the quarter-wavelength is about 7.5 mm, and the length of the passage is preferably many times smaller than this value. It is of course also the case that the length of bond wire 3 and of the other tracks must be smaller than a quarter-wavelength of a signal to be processed by the antenna. Bond wire 3 will for instance be 200 micrometres long.

Passage 2 and the printed tracks (including power supply line 7) are preferably gilded, and the bond wire is preferably manufactured from gold. Note that it is not necessary for the passage to be manufactured wholly from gold, since due to skin effects the signals run substantially on the surface of passage 2.

Owing to the above described construction with passage, the length of passage 2 and of the other coupling means (bond wire 3 and the printed tracks) can thus be kept short compared to a quarter-wavelength of the signal to be received, with the result that little disruption is encountered from the mismatch caused by passage 2.

This construction has been tested, and the simulation and measurement results show that the loss remains limited to less than 2 dB. The use of such a construction in an automobile moreover shows that the construction is very robust.

The skilled person will appreciate that the invention is not limited to the exemplary embodiment above, and that the scope of protection of the invention is defined solely by the claims following hereinbelow.

The invention claimed is:

1. Device comprising a patch antenna processing a high frequency signal above 10 GHz signal, and coupling means for connecting the antenna to an electronic component, wherein the patch antenna is arranged on a first side of an antenna printed circuit board and the electronic component is mounted on a second side of the antenna printed circuit board and wherein the coupling means comprise a metal passage through a hole in the antenna printed circuit board, the hole defining a wall and said passage being in direct contact with the wall of the hole and transposing into a bond pad in direct contact with and against the second side of the antenna printed circuit board, and a metal bond wire between the electronic component and the bond pad, wherein the length of the passage, as seen perpendicularly of the antenna printed circuit board, is many times smaller than a quarter-wavelength of the signal to be processed by the antenna.

2. Device as claimed in claim 1, wherein the length of the bond wire is smaller than a quarter-wavelength of the signal to be processed by the antenna.

3. Device as claimed in claim 1, wherein an electrically conductive plate for the patch antenna is arranged against the second side of the antenna printed circuit board wherein the electrically conductive plate is provided with a recess for the bond pad, said recess being such that said electrically conductive plate is spaced at a distance of a thickness of said bond pad; wherein the electronic component is mounted on the electrically conductive plate.

4. Device as claimed in claim 1, wherein the electronic component is a low noise amplifier.

5. Device as claimed in claim 1, wherein the passage has a substantially cylindrical form.

6. Device as claimed in claim 1, wherein on the side of the antenna the passage makes direct contact with a power supply line of the patch antenna.

7. Device as claimed in claim 6, wherein the periphery of the passage calculated as the diameter multiplied by $\pi$ substantially corresponds with the width of the power supply line.

8. Radar receiver provided with a device as claimed in claim 1.

9. Device comprising a patch antenna processing a high frequency signal above 10 GHz and coupling means for connecting the antenna to an electronic component, wherein the patch antenna is arranged on a first side of an antenna printed circuit board wherein the electronic component is mounted on a second side of the antenna printed circuit board and wherein the coupling means comprise a metal via through the antenna printed circuit board which transposes into a bond pad in direct contact with and against the second side of the antenna printed circuit board on the second side, and a metal bond wire between the electronic component and the bond pad, wherein the length of the via, as seen perpendicularly of the antenna printed circuit board, is many times smaller than a quarter-wavelength of the signal to be processed by the antenna.

10. Device as claimed in claim 9, wherein an electrically conductive plate for the patch antenna is arranged against the second side of the antenna printed circuit board, wherein the electrically conductive plate is provided with a recess for the bond pad, such that the electrically conductive plate forms a ground plane for the antenna, and said recess being such that said electrically conductive plate is spaced at a distance of a thickness of said bond plate; wherein the electronic component is mounted on the electrically conductive plate.

11. Device as claimed in claim 9, wherein the length of the bond wire is smaller than a quarter-wavelength of the signal to be processed by the antenna.

12. Device as claimed in claim 9, wherein the electronic component is a low noise amplifier.

13. Device as claimed in claim 9, wherein the via has a substantially cylindrical form.

14. Device as claimed in claim 9, wherein on the side of the antenna the via makes direct contact with a power supply line of the patch antenna.

15. Device as claimed in claim 14, wherein the periphery of the passage calculated as the diameter multiplied by $\pi$ substantially corresponds with the width of the power supply line.

* * * * *